(12) United States Patent
Hasegawa

(10) Patent No.: US 6,274,921 B1
(45) Date of Patent: Aug. 14, 2001

(54) SEMICONDUCTOR INTEGRATED CIRCUIT INCLUDING PROTECTIVE TRANSISTOR PROTECTING ANOTHER TRANSISTOR DURING PROCESSING

(75) Inventor: Kouichi Hasegawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/061,248

(22) Filed: Apr. 17, 1998

(30) Foreign Application Priority Data

Dec. 22, 1997 (JP) .................................................. 9-353811

(51) Int. Cl.[7] .......................... H01L 27/082; H01L 29/40
(52) U.S. Cl. ........................ 257/577; 257/578; 257/584; 257/587; 257/47
(58) Field of Search .................................... 257/577, 578, 257/584, 587, 47

(56) References Cited

U.S. PATENT DOCUMENTS 4,808,259  2/1989  Jillie, Jr. et al. .
4,916,512 * 4/1990  Ohmi et al. ............................ 357/30
5,583,474 * 12/1996 Mizoguchi et al. ................... 336/83

FOREIGN PATENT DOCUMENTS 63117468  5/1988  (JP) .
 8306922  11/1996  (JP) .

* cited by examiner

Primary Examiner—Olik Chaudhuri
Assistant Examiner—Shrinivas H. Rao
(74) Attorney, Agent, or Firm—Leydig, Voit & Mayer, Ltd.

(57) ABSTRACT

A semiconductor integrated circuit has a protective NMOS transistor having a drain and a source respectively electrically connected to a first interconnection (electrically connected to a base electrode of a bipolar transistor or a gate electrode of a MOS transistor) and ground and a gate electrode in a floating state, upon formation of the first interconnection. The first interconnection is formed by patterning using plasma etching and is connected to ground after the formation of the first interconnection.

10 Claims, 9 Drawing Sheets

SEMICONDUCTOR INTEGRATED CIRCUIT INCLUDING PROTECTIVE TRANSISTOR PROTECTING ANOTHER TRANSISTOR DURING PROCESSING

BACKGROUND OF THE INVENTION

1. Field of the Invention

The present invention relates to a semiconductor integrated circuits in which it is hard to cause a breakdown and leakage current to breakdown, of an oxide film of a bipolar transistor and an MOS transistor due to the formation of interconnections (including one having a spiral inductor and a pad) electrically connected to the bipolar transistor and the MOS transistor by patterning through plasma etching and, and a process for manufacturing the, semiconductor integrated circuit.

2. Description of the Prior Art

Progress in high integration of semiconductor integrated circuits has been made in recent years. With high integration, the distance between the base and emitter of a bipolar transistor that constitutes a semiconductor integrated circuit, has been reduced. In a bipolar transistor employed in a high-frequency circuit, for example, the distance between the base and emitter has been reduced to increase cut-off frequency. With its high integration as well, a gate oxide film of a MOS transistor that constitutes a semiconductor integrated circuit, has been reduced in thickness.

With a view toward implementing the high integration of such a semiconductor integrated circuit, plasma etching is used in a process for manufacturing bipolar and MOS transistors.

The term plasma etching means a method of etching using ions and atoms in a plasma produced by a glow discharge in a reactive gas. In this case, the state of the plasma depends on etching conditions such as the type of reactive gas, etc. The etching using the ions in the plasma is performed as follows: Electrons in the plasma, which have been produced by a glow discharge of a reactive gas between negative and positive electrodes, are allowed to rapidly reach both electrodes to thereby produce a negative potential between the two electrodes. Thereafter, ions in the plasma are accelerated under the negative potential to impact on a wafer.

Incidentally, the density of the plasma results in nonuniformity on the wafer surface due to the nonuniformity of the plasma upon plasma etching, whereby the wafer is locally charged within the wafer surface. Upon patterning by plasma etching, electrical charges are borne between upper and lower portions of a pattern due to overetching.

The above-described plasma etching has been used in the conventional manufacturing process of the semiconductor integrated circuit.

In a bipolar transistor of a DPSA (Double Poly-Si Self-Aligned) structure shown in FIG. 15, which is employed in a high-frequency circuit, for example, the thickness of an insulating oxide film 146 located between a base electrode 138 and an emitter electrode 142 is set to a range of 0.1 $\mu$m to 0.2 $\mu$m to reduce the distance between the base electrode 138 and the emitter electrode 142. Therefore, when an interconnection 103 electrically connected to the base electrode 138 is formed by patterning through plasma etching, the interconnection 103 is charged by ions and electrons resultant from a plasma, so that a current flows between the base electrode 138 and the emitter electrode 142 through the insulating oxide film 146 located between the two electrodes. As a result, a problem arose in that a breakdown of the insulating oxide film 146 located between the base electrode 138 and the emitter electrode 142 due to plasma etching and a leakage current flowing between the base electrode 138 and the emitter electrode 142 incident to its breakdown would occur in the post-manufacture bipolar transistor. The manner in which the current flows between the base electrode 138 and the emitter electrode 142 through the insulating oxide film 146 located between the two electrodes, is shown in FIG. 15 by the arrow indicated by a broken line.

Similarly, in a MOS transistor shown in FIG. 16, which responds to high integration, for example, the thickness of a gate oxide film 151 is set to about 1500 nm. Therefore, when an interconnection 103 electrically connected to a gate electrode 152 is formed by patterning through plasma etching, the interconnection 103 is charged by ions and electrons resultant from a plasma, so that a current flows between the gate electrode 152 and a substrate 131 through the gate oxide film 151. As a result, a problem arose in that a breakdown of the gate oxide film 151 due to plasma etching and a leakage current flowing between the gate electrode 152 and the substrate 131 incident to its breakdown would occur in the post-manufacture MOS transistor. The manner in which the current flows between the gate electrode 152 and the substrate 131 through the gate oxide film 151, is shown in FIG. 16 by the arrow indicated by a broken line.

SUMMARY OF THE INVENTION

The present invention has been accomplished for solving the above-mentioned problems and it is an object of the present invention to provide a semiconductor integrated circuit which is in little danger of producing a breakdown of an oxide film due to plasma etching and a leakage current incident to its breakdown in post-manufacture bipolar and MOS transistors, and a process for manufacturing the semiconductor integrated circuit.

According to a first aspect of this invention, there is provided a semiconductor integrated circuit comprising a bipolar transistor, an interconnection electrically connected to a base electrode of the bipolar transistor, and a protective NMOS transistor having a drain electrically connected to the interconnection, a source electrically connected to ground and a gate electrode placed in a floating state upon formation of the interconnection by patterning through plasma etching, the protective NMOS transistor being in an OFF state free of the flow of a current between the source and drain thereof after the formation of the interconnection.

According to the first aspect, an advantageous effect is brought about in that since the semiconductor integrated circuit is constructed so as to have the bipolar transistor, the interconnection electrically connected to the base electrode of the bipolar transistor, and the protective NMOS transistor which includes the drain electrically connected to the interconnection, the source electrically connected to ground and the gate electrode placed in the floating state upon formation of the interconnection by patterning through plasma etching, and which is in the OFF state free of the flow of the current between the source and drain thereof after the formation of the interconnection, the semiconductor integrated circuit can reduce the risk of producing a breakdown of an insulating oxide film located between the base and emitter electrodes due to plasma etching and a leakage current flowing between the base and emitter electrodes incident to its breakdown in the post-manufacture bipolar transistor.

According to a second aspect of this invention, there is provided a semiconductor integrated circuit wherein an interconnection has a spiral inductor and a first portion for electrically connecting a base electrode of a bipolar transistor and the spiral inductor to each other.

According to a third aspect of this invention, there is provided a semiconductor integrated circuit wherein an interconnection has a pad and a first portion for electrically connecting a base electrode of a bipolar transistor and the pad to each other.

According to a fourth aspect of this invention, there is provided a semiconductor integrated circuit wherein an interconnection has a spiral inductor, a pad, a first portion for electrically connecting a base electrode of a bipolar transistor and the spiral inductor to each other, and a second portion for electrically connecting the spiral inductor and the pad to each other.

According to a fifth aspect of this invention, there is provided a semiconductor integrated circuit wherein an interconnection has a spiral inductor, a pad, a first portion for electrically connecting a base electrode of a bipolar transistor and the spiral inductor to each other, and a second portion for electrically connecting the spiral inductor and the pad to each other, the position where the interconnection and the drain of a protective NMOS transistor are connected to each other at the formation of the interconnection by plasma etching is set as the first portion.

According to the fifth aspect, an advantageous effect is brought about in that since the semiconductor integrated circuit is constructed in such a manner that the interconnection has the spiral inductor, the pad, the first portion for electrically connecting the base electrode of the bipolar transistor and the spiral inductor to each other, and the second portion for electrically connecting the spiral inductor and the pad to each other, and the position where the interconnection and the drain of the protective NMOS transistor are connected to each other at the formation of the interconnection by plasma etching is set as the first portion, the protective NMOS transistor being placed in an OFF state can reduce the potential for becoming an ON state due to impact produced when a lead terminal is electrically connected to the pad even when the lead terminal is electrically connected to the pad after the formation of the interconnection.

According to a sixth aspect of this invention, there is provided a semiconductor integrated circuit comprising a MOS transistor, an interconnection electrically connected to a gate electrode of the MOS transistor, and a protective NMOS transistor having a drain electrically connected to the interconnection, a source electrically connected to ground and a gate electrode placed in a floating state upon formation of the interconnection by patterning through plasma etching, the protective NMOS transistor being in an OFF state free of the flow of a current between the source and drain thereof after the formation of the interconnection.

According to the sixth aspect of this invention, an advantageous effect is brought about in that since the semiconductor integrated circuit is constructed so as to have the MOS transistor, the interconnection electrically connected to the gate electrode of the MOS transistor, and the protective NMOS transistor which has the drain electrically connected to the interconnection, the source electrically connected to ground and the gate electrode placed in the floating state upon formation of the interconnection by patterning through plasma etching and which is in the OFF state free of the flow of the current between the source and drain thereof after the formation of the interconnection, the semiconductor integrated circuit can reduce the potential that a breakdown of a gate oxide film due to plasma etching and a leakage current flowing between a gate electrode and a substrate incident to its breakdown will occur in the post-manufacture MOS transistor.

According to a seventh aspect of this invention, there is provided a semiconductor integrated circuit wherein an interconnection has a spiral inductor, and a first portion for electrically connecting a gate electrode of a MOS transistor and the spiral inductor to each other.

According to an eighth aspect of this invention, there is provided a semiconductor integrated circuit wherein an interconnection has a pad and a first portion for electrically connecting a gate electrode of a MOS transistor and the pad to each other.

According to a ninth aspect of this invention, there is provided a semiconductor integrated circuit wherein an interconnection has a spiral inductor, a pad, a first portion for electrically connecting a gate electrode of a MOS transistor and the spiral inductor to each other, and a second portion for electrically connecting the spiral inductor and the pad to one another.

According to a tenth aspect of this invention, there is provided a semiconductor integrated circuit wherein an interconnection has a spiral inductor, a pad, a first portion for electrically connecting a gate electrode of a MOS transistor and the spiral inductor to each other, and a second portion for electrically connecting the spiral inductor and the pad to each other, the position where the interconnection and the drain of a protective NMOS transistor are connected to each other at the formation of the interconnection by plasma etching is set as the first portion.

According to the tenth aspect, an advantageous effect is brought about in that since the semiconductor integrated circuit is constructed in such a manner that the interconnection has the spiral inductor, the pad, the first portion for electrically connecting the gate electrode of the MOS transistor and the spiral inductor to each other and the second portion for electrically connecting the spiral inductor and the pad to each other, and the position where the interconnection and the drain of the protective NOMS transistor are connected to each other at the formation of the interconnection by plasma etching is set as the first portion, the protective NMOS transistor placed in an OFF state can reduce the potential for becoming an ON state due to impact produced when a lead terminal is electrically connected to the pad even when the lead terminal is electrically connected to the pad after the formation of the interconnection.

According to an eleventh aspect of this invention, there is provided a process for manufacturing a semiconductor integrated circuit having a bipolar transistor and an interconnection electrically connected to a base electrode of the bipolar transistor, comprising the following steps of manufacturing a protective NMOS transistor whose gate electrode is in a floating state, before a conductive layer is formed, thereafter forming the conductive layer to connect the conductive layer with the drain of the protective NMOS transistor and connect the source of the protective NMOS transistor with ground, thereafter forming the interconnection by patterning the conductive layer through plasma etching in a state in which an electrical connection between the drain of the protective NMOS transistor and the base electrode of the bipolar transistor and an electrical connection between the source of the protective NMOS transistor and ground are being held, and thereafter bringing the protective NMOS transistor into an OFF state free of the flow of a current between the source and drain thereof.

According to the eleventh aspect, an advantageous effect is brought about in that since the semiconductor integrated circuit is fabricated by manufacturing the protective NMOS transistor whose gate electrode is in the floating state, before the conductive layer is formed, thereafter forming the conductive layer to connect the conductive layer with the drain of the protective NMOS transistor and connect the source of the protective NMOS transistor with ground, thereafter forming the interconnection by patterning the conductive layer through plasma etching in the state in which the electrical connection between the drain of the protective NMOS transistor and the base electrode of the bipolar transistor and the electrical connection between the source of the protective NMOS transistor and ground are being held, and thereafter bringing the protective NMOS transistor into the OFF state free of the flow of the current between the source and drain thereof, a semiconductor integrated circuit can be manufactured which is capable of reducing the potential that a breakdown of an insulating oxide film located between the base and emitter electrodes due to plasma etching and a leakage current flowing between the base and emitter electrodes incident to its breakdown will occur in the post-manufacture bipolar transistor.

According to a twelfth aspect of this invention, there is provided a process for manufacturing a semiconductor integrated circuit having a MOS transistor and an interconnection electrically connected to a gate electrode of the MOS transistor, comprising the following steps of manufacturing a protective NMOS transistor whose gate electrode is placed in a floating state, before a conductive layer is formed, thereafter forming the conductive layer to connect the conductive layer with the drain of the protective NMOS transistor and connect the source of the protective NMOS transistor with ground, thereafter forming the interconnection by patterning the conductive layer through plasma etching in a state in which an electrical connection between the drain of the protective NMOS transistor and the gate electrode of the MOS transistor and an electrical connection between the source of the protective NMOS transistor and ground are being held, and thereafter bringing the protective NMOS transistor into an OFF state free of the flow of a current between the source and drain thereof.

According to the twelfth aspect, an advantageous effect is brought about in that since the semiconductor integrated circuit is fabricated by manufacturing the protective NMOS transistor whose gate electrode is placed in the floating state, before the conductive layer is formed, thereafter forming the conductive layer to connect the conductive layer with the drain of the protective NMOS transistor and connect the source of the protective NMOS transistor with ground, thereafter forming the interconnection by patterning the conductive layer through plasma etching in the state in which the electrical connection between the drain of the protective NMOS transistor and the gate electrode of the MOS transistor and the electrical connection between the source of the protective NMOS transistor and ground are being held, and thereafter bringing the protective NMOS transistor into the OFF state free of the flow of the current between the source and drain thereof, a semiconductor integrated circuit can be manufactured which is capable of reducing the potential that a breakdown of a gate oxide film due to plasma etching and a leakage current flowing between the gate electrode and a substrate incident to its breakdown will occur in the post-manufacture MOS transistor.

DETAILED DESCRIPTION OF THE PREFERRED EMBODIMENTS

Embodiments of the present invention will hereinafter be described below.

First Embodiment

Figure 1:
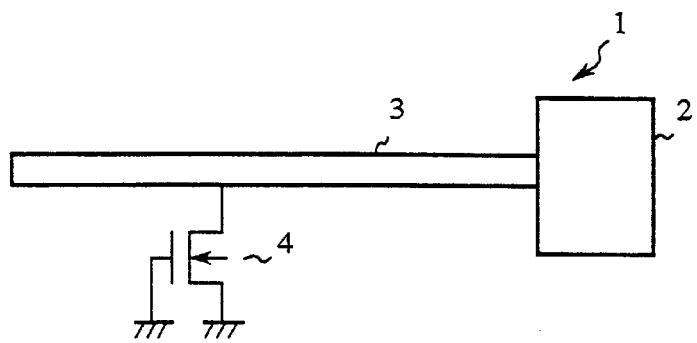
FIG. 1 is a typical configurational diagram showing a semiconductor integrated circuit according to a first embodiment of the present invention.

FIG. 1 is a typical configurational diagram showing a semiconductor integrated circuit according to a first embodiment of this invention. Referring to FIG. 1, reference numeral 1 indicates a semiconductor integrated circuit. Reference numeral 2 indicates a transistor region in which bipolar and MOS transistors are formed. Reference numeral 3 indicates a first interconnection (an interconnetion) composed of aluminum, which is electrically connected to a base electrode of a bipolar transistor or a gate electrode of a MOS transistor formed in the transistor region 2. Reference numeral 4 indicates a protective NMOS transistor whose drain and source are respectively electrically connected to the first interconnection 3 and ground and whose gate electrode is in a floating state (corresponding to a state of being no connected to anywhere) during formation of the first interconnection 3 by patterning through plasma etching, and which is electrically connected to ground after the formation of the first interconnection 3.

Since the gate of the protective NMOS transistor 4 is held in the floating state during formation of the first interconnection 3 by patterning through plasma etching, the protective NMOS transistor 4 is in an ON state in which a current flows between the source and drain thereof. Therefore, even if the first interconnection 3 is charged by ions and electrons resultant from a plasma when the first interconnection 3 is formed by patterning through plasma etching, the current flows between the source and drain of the protective NMOS transistor 4 without flowing through an oxide film. As a result, the post-manufacture bipolar transistor and MOS transistor are in small danger of causing the destruction or breakdown of the oxide film due to plasma etching and producing a leakage current incident to its breakdown. On the other hand, since the gate of the protective NMOS transistor 4 is electrically connected to ground after the formation of the first interconnection 3, the protective NMOS transistor 4 is in an OFF state in which no current flows between the source and drain thereof. Therefore, the current does not flow between the source and drain of the protective NMOS transistor 4 upon activating a circuit comprised by the transistors formed in the transistor region 2. As a result, the protective NMOS transistor 4 exerts no bad influence on the circuit comprised by the transistors formed in the transistor region 2.

Figure 2A:
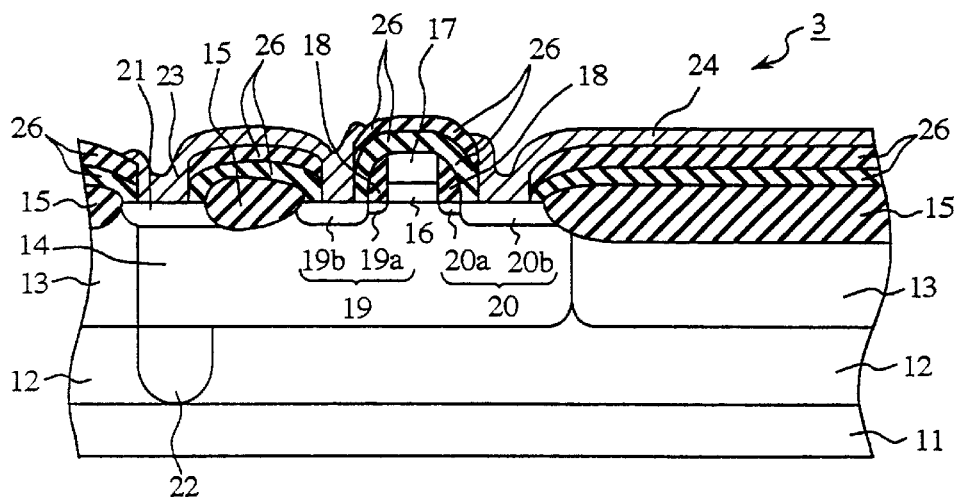
FIGS. 2A and 2B are respectively schematic configurational diagrams illustrating a protective NMOS transistor which constitutes a semiconductor integrated circuit according to a first embodiment of the present invention.
Figure 2B:
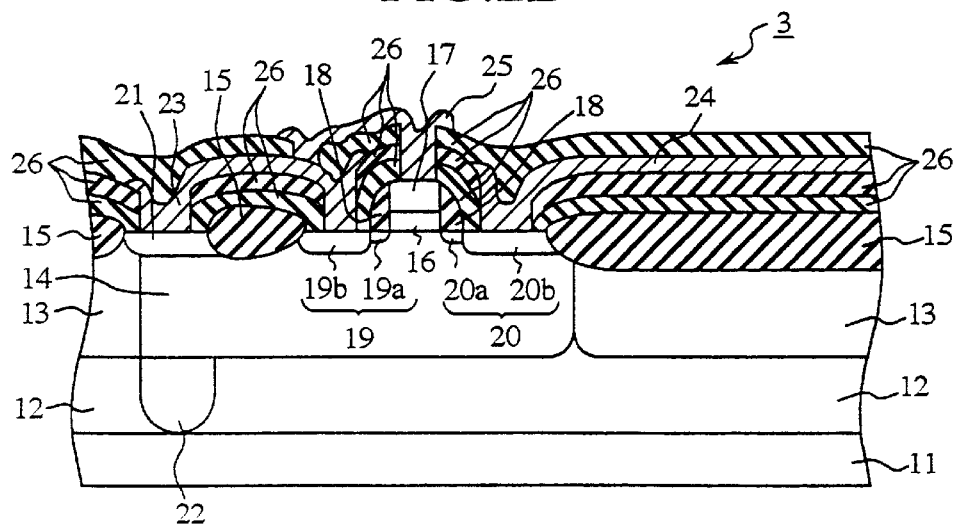

FIGS. 2A and 2B are respectively schematic configurational diagrams showing the protective NMOS transistor electrically connected to the first interconnection. FIG. 2A shows the protective NMOS transistor 4 in the ON state upon formation of the first interconnection 3 by patterning through plasma etching. FIG. 2B illustrates the protective NMOS transistor 4 in the OFF state after the formation of the first interconnection 3. Referring to FIGS. 2A and 2B, reference numerals 11, 12, 13, 14, 15, 16, 17, 18, 19, 20, 21, 22, 23, 24, 25 and 26 respectively indicate a p-type substrate, an n-type epitaxial layer, an n well, a p well, a field oxide film, a gate oxide film, a gate electrode composed of polysilicon doped with an n-type impurity, a side-wall oxide film formed on the side wall of the gate electrode 17, a source composed of an n-type diffused layer 19a and an $n^+$-type diffused layer 19b, a drain comprised of an $n^1$-type diffused layer 20a and an $n^+$-type diffused layer 20b, a $p^+$-type contact layer, a p-type diffused layer for electrically connecting the p-type substrate 11 and the p well 14 to each other, a second interconnection comprised of aluminum, for electrically connecting the source 19 and the $p^+$-type contact layer 21 to each other, a third interconnection comprised of aluminum, for electrically connecting the drain 20 and the first interconnection (not shown) to each other, a fourth interconnection comprised of aluminum, for electrically connecting the gate electrode 17 and the second interconnection 23 to each other, and an insulating oxide film. For example, a gate length of the protective NMOS transistor 4 is 0.8 μm and a gate width thereof is 2 μm.

Figure 3:
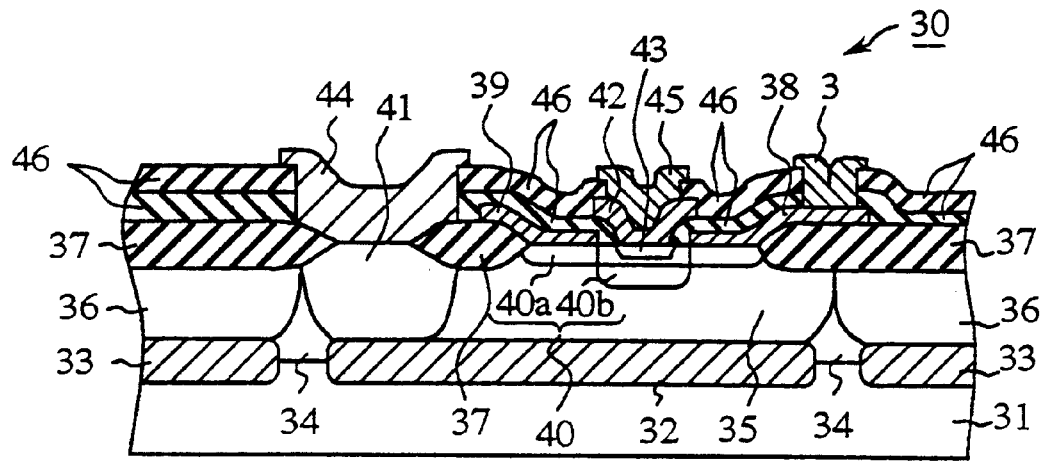
FIG. 3 is a schematic configurational diagram depicting an npn transistor formed in a transistor region of a semiconductor integrated circuit according to a first embodiment of the present invention.

FIG. 3 is a schematic configurational diagram showing an npn transistor of a DPSA structure in which a first interconnection is electrically connected to a base electrode thereof. Referring to FIG. 3, reference numerals 30, 31, 32, 33, 34, 35, 36, 37, 38, 39, 40, 41, 42, 43, 44, 45 and 46 respectively indicate an npn transistor (bipolar transistor), a p-type substrate, an $n^+$-type buried layer, a $p^+$-type buried layer, an n-type epitaxial layer, an n well which serves as a collector, a p well, a field oxide film, a base electrode comprised of polysilicon doped with a p-type impurity, a polysilicon film doped with the p-type impurity, which is formed in accordance with the same process as that for the base electrode 38, a base made up of a $p^+$-type diffused layer 40a and a p-type diffused layer 40b, a contact layer comprised of an ne-type diffused layer, an emitter electrode comprised of polysilicon doped with an n-type impurity, an emitter comprised of an $n^+$-type diffused layer, a collector electrode comprised of aluminum, which is electrically connected to the contact layer 41, a fifth interconnection comprised of aluminum, which is electrically connected to the emitter electrode 42, and an insulating oxide film. Also designated at numeral 3 is the first interconnection comprised of aluminum, which is electrically connected to the base electrode 38. The bipolar transistor having the DPSA structure corresponds to one having a structure wherein the polysilicon constituting the emitter electrode and the polysilicon constituting the base electrode are formed in layers different from each other.

Figure 4:
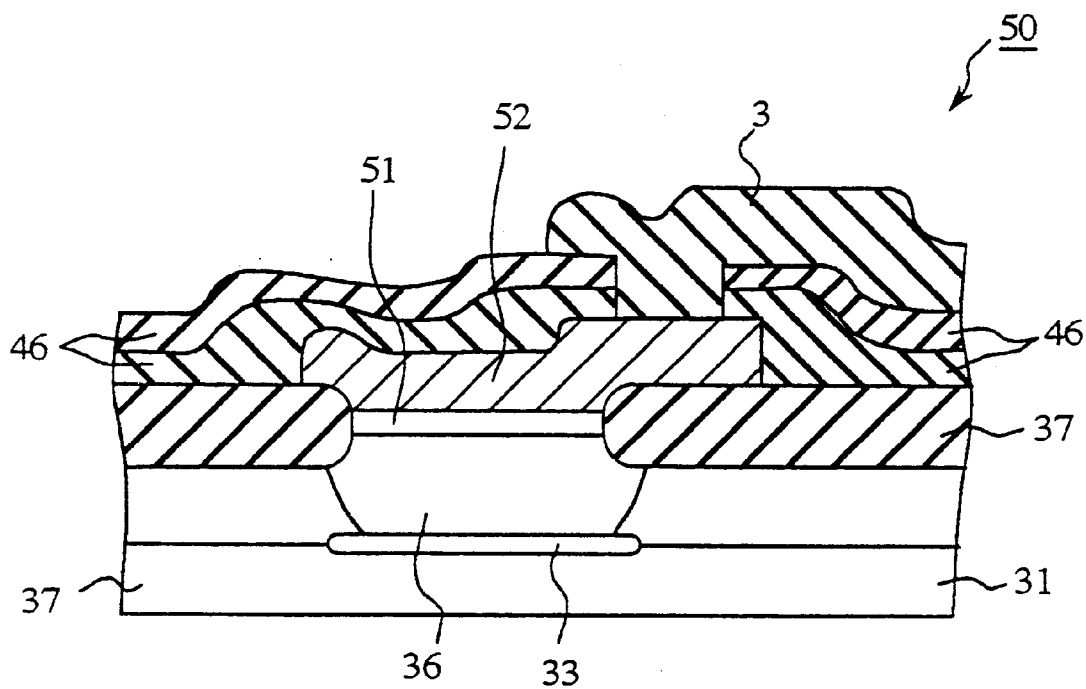
FIG. 4 is a schematic configurational diagram showing an NMOS transistor formed in the transistor region of a semiconductor integrated circuit according to a first embodiment of the present invention.

FIG. 4 is a schematic configurational diagram showing an NMOS transistor in which a first interconnection is electrically connected to a gate electrode thereof. Referring to FIG. 4, reference numerals 50, 51 and 52 indicate an NMOS transistor (a MOS transistor), a gate oxide film, and a gate electrode comprised of polysilicon doped with an n-type impurity, respectively. Further, reference numerals 31, 33, 34, 36, 37 and 46 indicate a p-type substrate, a $p^+$-type buried layer, an n-type epitaxial layer, a p well, a field oxide film and an insulating oxide film, respectively. Designated at numeral 3 is the first interconnection comprised of aluminum, which is electrically connected to the gate electrode 52. For example, a gate length of the NMOS transistor 50 is 0.8 μm and a gate width thereof is 4μm.

Figure 5:
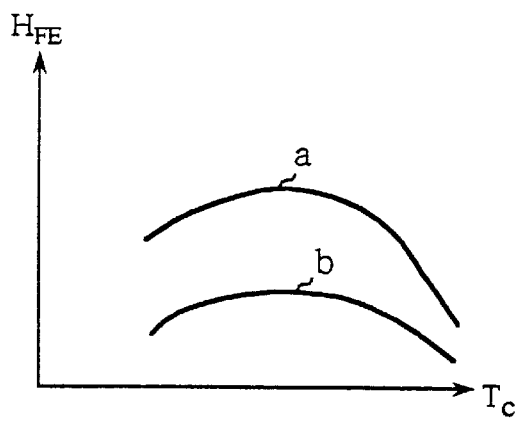
FIG. 5 is a characteristic diagram illustrating the relationship between a current amplification factor and a collector current both employed in the npn transistor.

Now consider where the protective NMOS transistor 4 shown in FIGS. 2A and 2B is electrically connected to the first interconnection 3 electrically connected to the base electrode 38 of the npn transistor 30 shown in FIG. 3. In this case, a current flows between the source 19 and drain 20 of the protective NMOS transistor 4 without flowing through the insulating oxide film 46 located between the based electrode 38 and the emitter electrode 42 even when the first interconnection 3 is charged by ions and electrons resultant from a plasma upon forming the first interconnection 3 by patterning through plasma etching. Thus, a breakdown of the insulating oxide film 46 located between the base electrode 38 and the emitter electrode 42 due to plasma etching and a leakage current flowing between the base electrode 38 and the emitter electrode 42 incident to its breakdown no longer occur in the post-manufacture npn transistor 30. As a result, a current amplification factor HFE becomes large as shown in FIG. 5 when the protective NMOS transistor 4 is electrically connected to the first interconnection 3 (see a curved line a) as compared with the case in which the protective NMOS transistor 4 is electrically disconnected from the first interconnection 3 (see a curved line b). The vertical axis of FIG. 5 indicates a current amplification a factor EFE and the horizontal axis of FIG. 5 indicates a collector current $I_c$.

Figure 6:
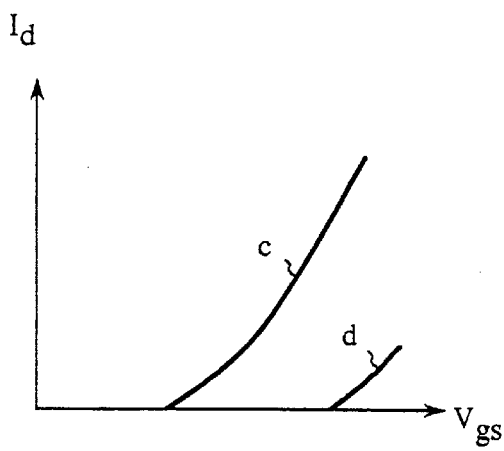
FIG. 6 is a characteristic diagram depicting the relationship between a drain current and a gate-to-source voltage both employed in the NMOS transistor.

Now consider where the protective NMOS transistor 4 shown in FIGS. 2A and 2B is electrically connected to the first interconnection 3 electrically connected to the gate electrode 52 of the NMOS transistor 50 shown in FIG. 4. In this case, a current flows between the source 19 and drain 20 of the protective NMOS transistor 4 without flowing through the gate oxide film 51 even when the first interconnection 3 is charged by ions and electrons produced from a plasma upon forming the first interconnection 3 by patterning through plasma etching. Thus, a breakdown of the gate oxide film 51 due to plasma etching and a leakage current flowing between the gate electrode 52 and the p-type substrate 31 incident to its breakdown no longer occur in the post-manufacture NMOS transistor 50. As a result, a threshold voltage becomes small as shown in FIG. 6 when the protective NMOS transistor 4 is electrically connected to the first interconnection 3 (see a curved line c) as compared with the case in which the protective NMOS transistor 4 is electrically disconnected from the first interconnection 3 (see a curved line d). The vertical axis of FIG. 6 indicates a drain current Id and the horizontal axis of FIG. 6 indicates a gate-to-source voltage $V_{gs}$. Incidentally, the threshold voltage is equal to the value of a gate-to-source voltage $V_{gs}$. at the time that the drain current $I_d$ is 0.

A method of manufacturing a BiCMOS circuit corresponding to a semiconductor integrated circuit will next be described. FIGS. 7A and 7B, FIGS. 8A and 8B, FIGS. 9A and 9B and FIG. 10 are respectively schematic process diagrams for manufacturing the BiCMOS circuit.

Figure 7A:
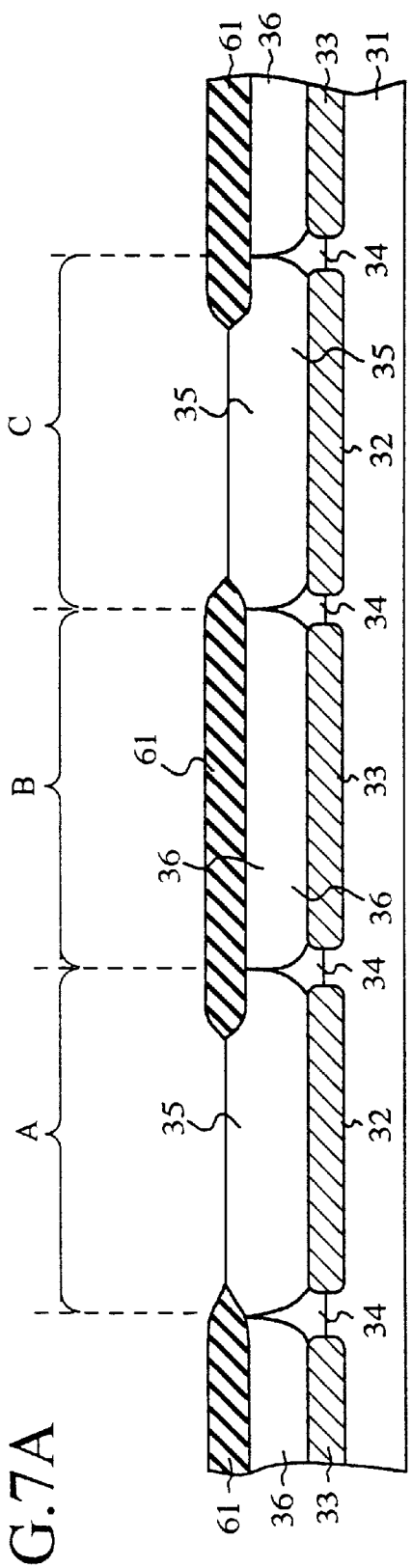
FIGS. 7A and 7B are respectively process diagrams for manufacturing a semiconductor integrated circuit according to a first embodiment of the present invention (process 1)

As shown in FIG. 7A, an n well 35 and a p well 36 are first formed on a p-type substrate 31. Incidentally, reference numerals 32, 33, 34 and 61 in FIG. 7A indicate an $n^+$-type buried layer, a $p^+$-type buried layer, an n-type epitaxial layer and an $n^+$-type diffused layer respectively. A in FIG. 7 indicates an npn transistor manufacturing region, B in FIG. 7 indicates an NMOS transistor manufacturing region and C in FIG. 7 indicates a PMOS transistor manufacturing region.

Figure 7B:
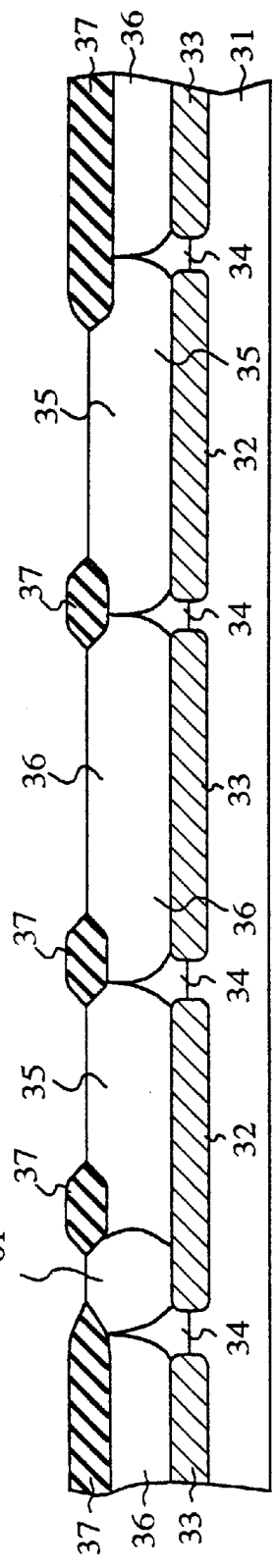

Thereafter, a field oxide film 37 is formed as shown in FIG. 7B. Further, an $n^+$-type diffused layer 61, which serves as a contact layer to which a collector electrode is electrically connected, is formed in the npn transistor manufacturing region A.

Figure 8A:
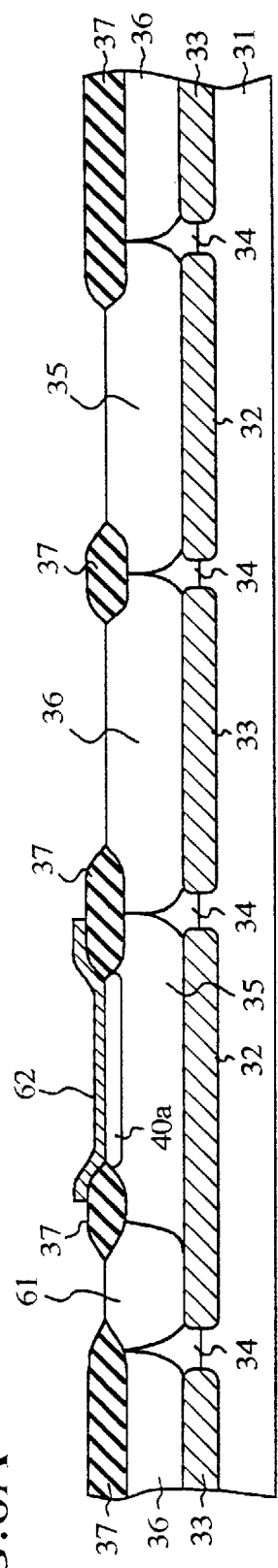
FIGS. 8A and 8B are respectively process diagrams for manufacturing a semiconductor integrated circuit according to a first embodiment of the present invention (process 2)

Afterwards, a polysilicon film 62 doped with a p-type impurity, which serves as a base electrode, is formed in the npn transistor manufacturing region A as shown in FIG. 8A. Further, a $p^+$-type diffused layer 40a, which serves as a base, is formed in the npn transistor manufacturing region A by thermal diffusion.

Figure 8B:
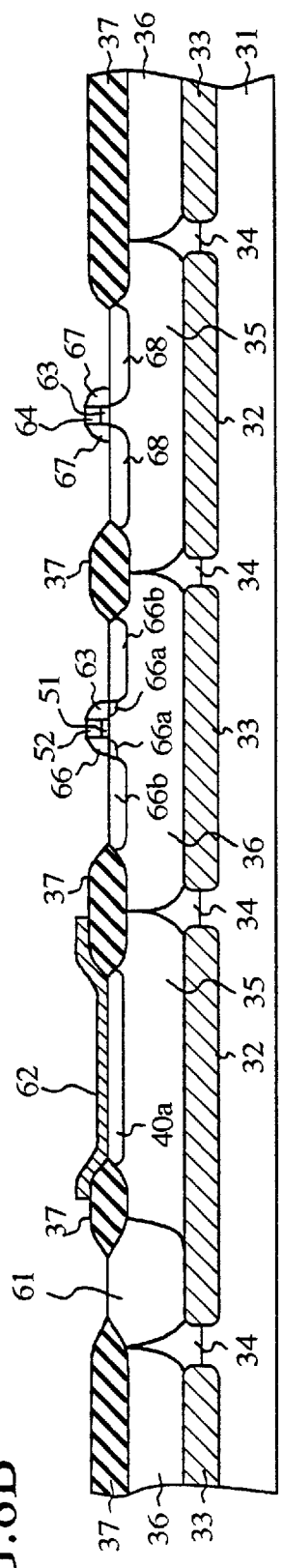

As shown in FIG. 8B, a gate oxide film 51 and a gate electrode 52 comprised of polysilicon doped with an n-type impurity are thereafter formed in the NMOS transistor manufacturing region B, whereas a gate oxide film 63 and a gate electrode 64 comprised of polysilicon doped with a p-type impurity, are formed in the PMOS transistor manufacturing region C. Further, a side-wall oxide film 65, and an n-type diffused layer 66a and an $n^+$-type diffused layer 66b serving as a source and a drain respectively are formed in the NMOS transistor manufacturing region B, whereas a side-wall oxide film 67, and $p^+$-type diffused layers 68 serving as a source and a drain, are formed in the PMOS transistor manufacturing region C.

Figure 9A:
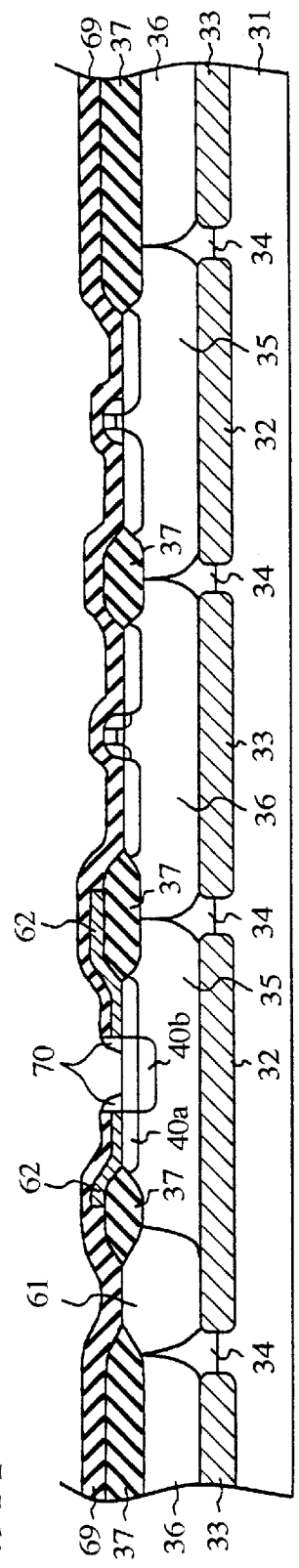
FIGS. 9A and 9B are respectively process diagrams for manufacturing a semiconductor integrated circuit according to a first embodiment of the present invention (process 3)

Thereafter, a first insulating oxide film 69 is formed over the respective regions A through C as shown in FIG. 9A. Further, an opening extending through the first insulating oxide film 69 and the polysilicon film 62 is defined in the npn transistor manufacturing region A. Thereafter, a p-type impurity is diffused into the n well 35 through the opening to form a p-type diffused layer 40b serving as a base. A second insulating oxide film 70 is formed on each side wall of the opening as a side-wall oxide film.

Figure 9B:
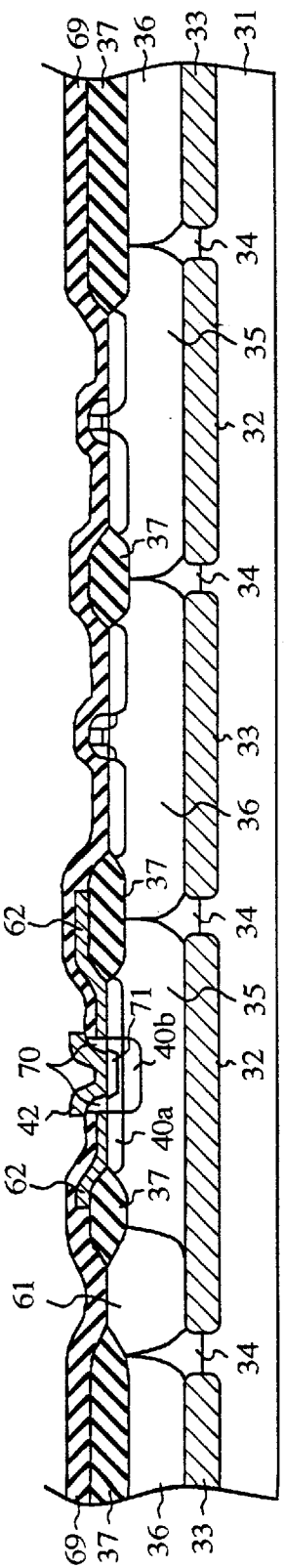

In the npn transistor manufacturing region A as shown in FIG. 9B, an n-type impurity is thereafter diffused into the p-type diffused layer 40b through an opening obtained after the formation of the second insulating oxide film 70 to form an $n^+$-type diffused layer 71 which serves as an emitter. Further, an emitter electrode 42 comprised of polysilicon doped with the n-type impurity is formed in the npn transistor manufacturing region A.

Figure 10:
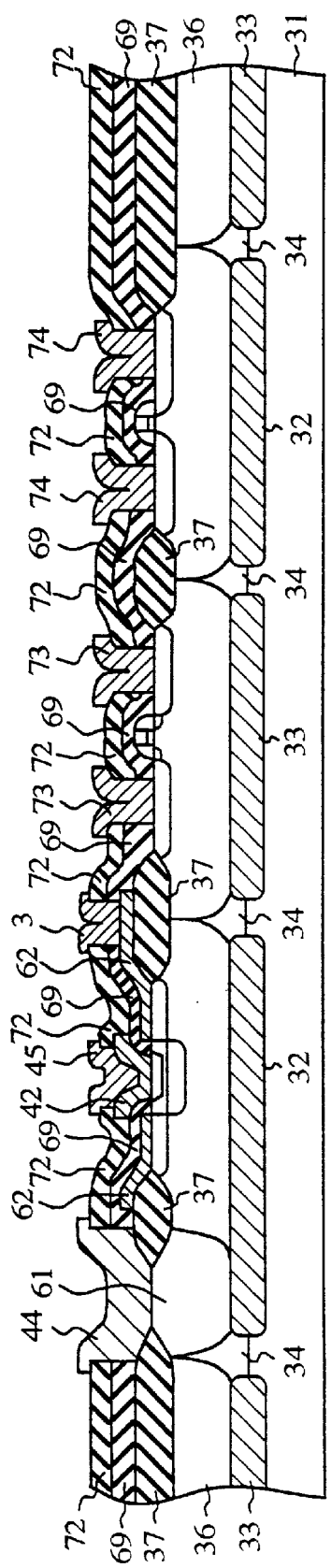
FIG. 10 is a process diagram for manufacturing the semiconductor integrated circuit shown in FIG. 1 (process 4)

Afterwards, a third insulating oxide film 72 is formed over each of the regions A through C as shown in FIG. 10. Further, an opening extending through the first insulating oxide film 69 and the third insulating oxide film 72 is defined in the npn transistor manufacturing region A to thereby form a first interconnection 3 comprised of aluminum, which is electrically connected to the polysilicon film 62 serving as the base electrode and a collector electrode 44 made up of aluminum, which is electrically connected to the $n^+$-type diffused layer 61 serving as the contact layer. Moreover, an opening penetrating the third insulating oxide film 72 is defined in the npn transistor manufacturing region A to form a fifth interconnection 45 comprised of aluminum, which is electrically connected to the emitter electrode 42. Each individual opening extending through the first insulating oxide film 69 and the third insulating oxide film 72 is defined in the NMOS transistor manufacturing region B to thereby form a sixth interconnection 73 comprised of aluminum, which is electrically connected to each of the $n^+$-type diffused layers 66b serving as the source and drain and a first interconnection (not shown) comprised of aluminum, which is electrically connected to the gate electrode 52. Each individual opening extending through the first insulating oxide film 69 and the third insulating oxide film 72 is defined in the PMOS transistor manufacturing region C to thereby form a seventh interconnection 74 comprised of aluminum, which is electrically connected to each of the $p^+$-type diffused layers 68 serving as the source and drain and a first interconnection (not shown) comprised of aluminum, which is electrically connected to the gate electrode 64. The first interconnection 3, the collector electrode 44, the fifth interconnection 45, the sixth interconnections 73 and the seventh interconnections 74 form aluminum films (conductive layers) over the respective regions A through C. The aluminum films are patterned and formed by plasma etching.

In accordance with the process steps described until now, the BiCMOS circuit having the npn transistor 30 shown in FIG. 3 and the NMOS transistor 50 shown in FIG. 4 are manufactured. Further, the protective NMOS transistor 4 shown in FIG. 2A is also formed simultaneously in accordance with the process steps shown in FIGS. 7A and 7B, FIGS. 8A and 8B, FIGS. 9A and 9B and FIG. 10.

When the aluminum film is formed upon manufacturing the BiCMOS circuit in this way, the aluminum film and the drain 20 of the protective NMOS transistor 4 shown in FIGS. 2A and 2B are electrically connected to each other, and the source 19 of the protective NMOS transistor 4 shown in FIGS. 2A and 2B and the $P^+$-type contact layer 21 are electrically connected to each other. When the aluminum film is patterned by plasma etching, electrical connections between the drain 20 of the protective NMOS transistor 4 shown in FIGS. 2A and 2B, the base electrode 38 of the npn transistor 30 shown in FIG. 3 and the gate electrode 52 of the NMOS transistor 50 shown in FIG. 4, and electrical connections between the source 19 of the protective NMOS transistor 4 shown in FIGS. 2A and 2B and the $p^+$-type contact layer 21 are maintained.

After the completion of plasma etching, the gate electrode 17 of the protective NMOS transistor 4 and the second interconnection 23 are electrically connected to each other by the fourth interconnection 25 as shown in FIG. 2B.

However, when the first interconnection 3 is provided with a spiral inductor and a pad as described in second and third embodiments, the fourth interconnection 25 is formed in a final process step.

According to the first embodiment, as has been described above, the protective NMOS transistor 4 has been electrically connected to the first interconnection 3 electrically connected to the base electrode of the bipolar transistor or the gate electrode of the MOS transistor. Therefore, even if the first interconnection 3 is charged by the ions and electrons resultant from the plasma upon forming the first interconnection 3 by patterning through plasma etching, the current will flow between the source 19 and drain 20 of the protective NMOS transistor 4 without flowing through the insulating oxide film 46 or the gate oxide film 51 located between the base electrode 38 and the emitter electrode 42. Thus, the breakdown of the insulating oxide film 46 located between the base electrode 38 and the emitter electrode 42 due to plasma etching and the leakage current flowing between the base electrode 38 and the emitter electrode 42 incident to its breakdown no longer occur in the post-manufacture npn transistor 30. As a result, an advantageous effect is brought about in that the current amplification factor becomes large as compared with the case in which the protective NMOS transistor 4 is electrically disconnected from the first interconnection 3. Similarly, the breakdown of the gate oxide film 51 due to plasma etching and the leakage current flowing between the gate electrode 52 and the p-type substrate 31 incident to its breakdown no longer occur in the post-manufacture NMOS transistor 50. As a result, an advantageous effect is brought about in that the threshold voltage becomes small as compared with the case in which the protective NMOS transistor 4 is electrically disconnected from the first interconnection 3.

Figure 11:
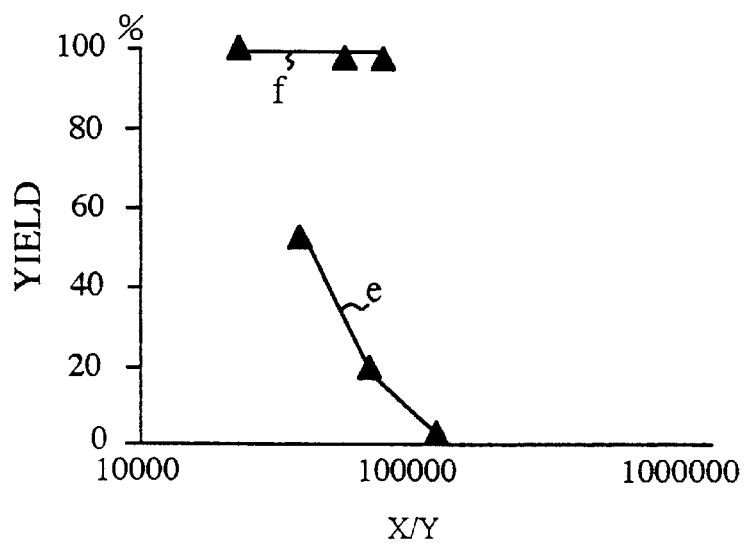
FIG. 11 is a characteristic diagram illustrating the relationship between a yield of an npn transistor and the ratio between the area of an interconnection electrically connected to a base electrode thereof and the area of a base thereof.

As shown in FIG. 11, in the npn transistor having the DPSA structure, when a protective NMOS transistor is disconnected from the interconnection connected to the base electrode (see a curved line e), the larger the ratio X/Y between the area X of an interconnection electrically connected to a base electrode and the area Y of a base as seen from the direction orthogonal to the surface of a wafer becomes, the smaller the yield becomes. However, when the protective NMOS transistor 4 is electrically connected to the interconnection connected to the base electrode (see a curved line f), the yield results in 100% regardless of the value of the ratio X/Y. The vertical axis of FIG. 11 indicates the yield, whereas the horizontal axis thereof indicates X/Y.

Second Embodiment

Figure 12:
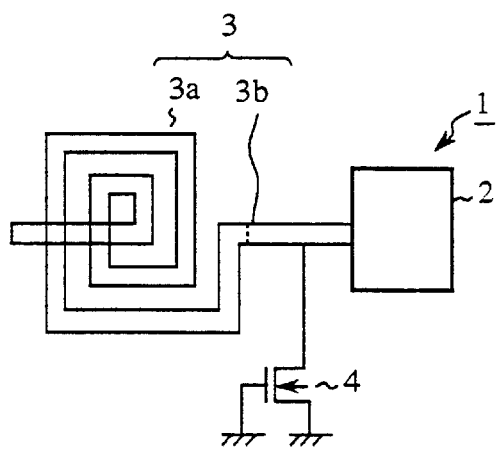
FIG. 12 is a typical configurational diagram showing a semiconductor integrated circuit according to a second embodiment of the present invention.

FIG. 12 is a typical configurational diagram showing a semiconductor integrated circuit according to a second embodiment of the present invention. Referring to FIG. 12, reference numerals 3a and 3b respectively indicate a spiral inductor and a first portion for electrically connecting a base electrode of a bipolar transistor formed in a transistor region 2 or a gate electrode of a MOS transistor formed therein to the spiral inductor 3a. Other elements of structure are the same as or equal to those shown in FIG. 1 with the same reference numerals affixed thereto.

In the second embodiment as shown in FIG. 12, a first interconnection 3 comprises the spiral inductor 3a and the first portion 3b for electrically connecting the base electrode of the bipolar transistor or the gate electrode of the MOS transistor to one another and the spiral inductor 3a. A protective NMOS transistor 4 is electrically connected to the first portion 3b.

Even when the first interconnection 3 is constructed in this way, an advantageous effect similar to that obtained in the first embodiment can be brought about.

Third Embodiment

Figure 13:
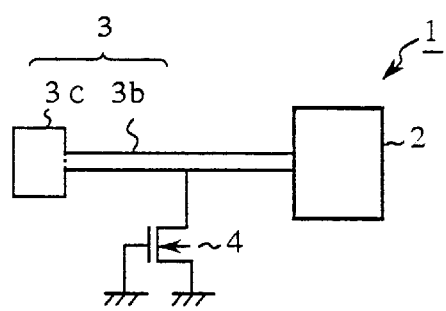
FIG. 13 is a typical configurational diagram depicting a semiconductor integrated circuit according to a third embodiment of the present invention.

FIG. 13 is a typical configurational diagram showing a semiconductor integrated circuit according to a third embodiment of the present invention. Referring to FIG. 13, reference numerals 3c and 3b respectively indicate a pad and a first portion for electrically connecting a base electrode of a bipolar transistor formed in a transistor region 2 or a gate electrode of a MOS transistor formed therein and the pad 3c to one another. Other elements of structure are the same as or equal to those shown in FIG. 1 with the same reference numerals affixed thereto.

In the third embodiment as shown in FIG. 13, a first interconnection 3 comprises the pad 3c and the first portion 3b for electrically connecting the base electrode of the bipolar transistor or the gate electrode of the MOS transistor and the pad 3c to one another. A protective NMOS transistor 4 is electrically connected to the first portion 3b.

Even when the first interconnection 3 is constructed in this way, an advantageous effect similar to that obtained in the first embodiment can be obtained.

Fourth Embodiment

Figure 14:
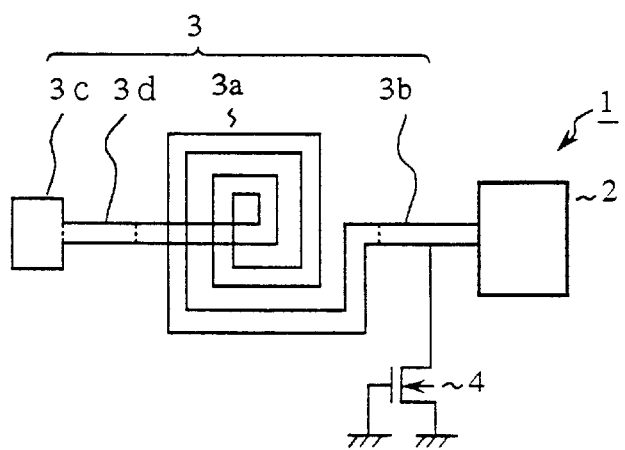
FIG. 14 is a typical configurational diagram illustrating a semiconductor integrated circuit according to a fourth embodiment of the present invention.
Figure 15:
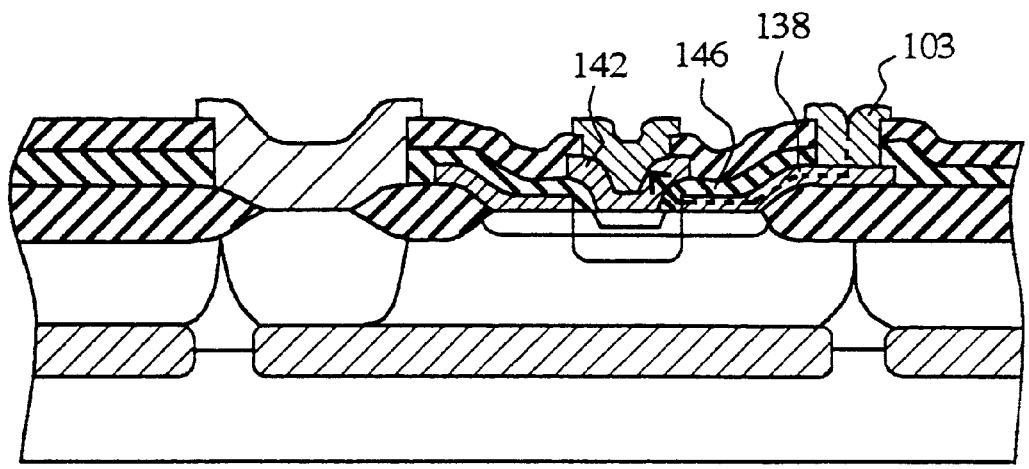
FIG. 15 is a diagram showing a configuration of a bipolar transistor having a DPSA structure.
Figure 16:
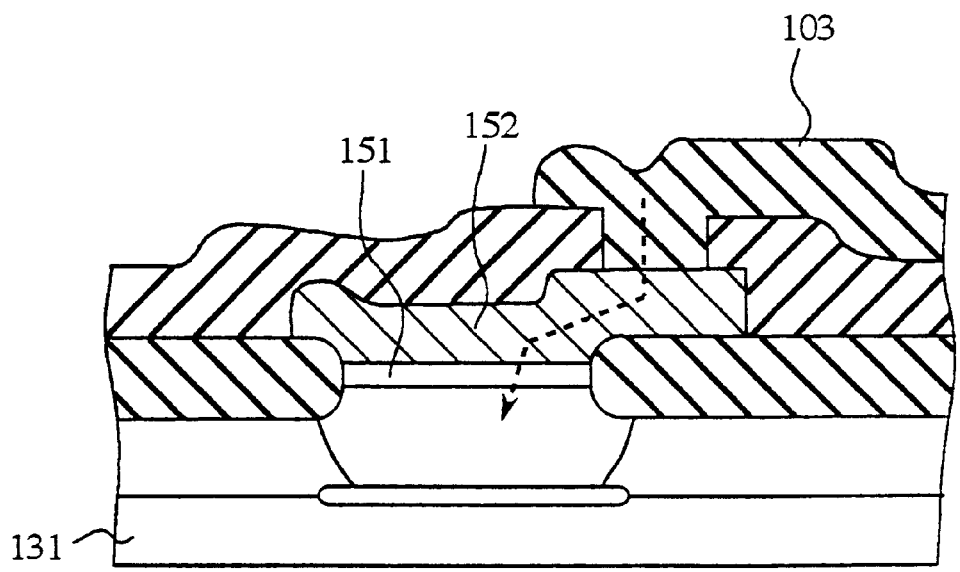
FIG. 16 is a diagram illustrating a configuration of a MOS transistor.

FIG. 14 is a typical configurational diagram showing a semiconductor integrated circuit according to a fourth embodiment of the present invention. Referring to FIG. 14, reference numerals 3a, 3c, 3b and 3d respectively indicate a spiral inductor, a pad, a first portion for electrically connecting a base electrode of a bipolar transistor formed in a transistor region 2 or a gate electrode of a MOS transistor formed therein and the spiral inductor 3a to each other, and a second portion for electrically connecting the spiral inductor 3a and the pad 3c to one another. Other elements of structure are the same as or equal to those shown in FIG. 1 with the same reference numerals affixed thereto.

In the fourth embodiment as shown in FIG. 14, a first interconnection 3 comprises the spiral inductor 3a, the pad 3c, the first portion 3b for electrically connecting the base electrode of the bipolar transistor or the gate electrode of the MOS transistor and the spiral inductor 3a to each other, and the second portion 3d for electrically connecting the spiral inductor 3a and the pad 3c to each other. A protective NMOS transistor 4 is electrically connected to the first portion 3b.

Even when the first interconnection 3 is constructed in this way, an advantageous effect similar to that obtained in the first embodiment can be obtained.

A lead is electrically connected to the pad 3c after the formation of the first interconnection 3. In the case that the protective NMOS transistor 4 is electrically connected to the second portion 3d, since the protective NMOS transistor 4 is close to the pad 3c, the protective NMOS transistor 4 placed in an OFF state has the potential for becoming an ON state due to impact produced when the lead is electrically connected to the pad 3c. Since, however, the protective NMOS transistor 4 is electrically connected to the first portion 3b in the fourth embodiment, such potential is small.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit comprising:

a bipolar transistor;

an interconnection electrically connected to a base electrode of said bipolar transistor; and a protective NMOS transistor having a drain electrically connected to said interconnection, a source electrically connected to ground and a gate electrode placed in a floating state during formation of said interconnection by patterning through plasma etching, said protective NMOS transistor being in an OFF state free of of a current flow between the source and the drain after formation of said interconnection.

2. A semiconductor integrated circuit according to claim 1, wherein said interconnection has a spiral inductor and a first portion for electrically connecting the base electrode of the bipolar transistor and said spiral inductor to each other.

3. The semiconductor integrated circuit according to claim 1, wherein said interconnection has a pad and a first portion electrically connecting the base electrode of the bipolar transistor and said pad to each other.

4. The semiconductor integrated circuit according to claim 1, wherein said interconnection has a spiral inductor, a pad, a first portion electrically connecting the base electrode of the bipolar transistor and said spiral inductor to each other, and a second portion electrically connecting said spiral inductor and said pad to each other.

5. The semiconductor integrated circuit according to claim 4, wherein said interconnection and the drain of said protective NMOS transistor are connected to each other upon formation of said interconnection by plasma etching, at the first portion.

6. A semiconductor integrated circuit comprising:

an MOS transistor;

an interconnection electrically connected to a gate electrode of said MOS transistor; and a protective NMOS transistor having a drain electrically connected to said interconnection, a source electrically connected to a ground and a gate electrode placed in a floating state during formation of said interconnection by patterning through plasma etching, said protective NMOS transistor being in an OFF state free of current flow between the source and the drain after the formation of said interconnection.

7. The semiconductor integrated circuit according to claim 6, wherein said interconnection has a spiral inductor and a first portion electrically connecting the gate electrode of said MOS transistor and said spiral inductor to each other.

8. The semiconductor integrated circuit according to claim 6, wherein said interconnection has a pad and a first portion electrically connecting the gate electrode of said MOS transistor and said pad to each other.

9. The semiconductor integrated circuit according to claim 6, wherein said interconnection has a spiral inductor, a pad, a first portion electrically connecting the gate electrode of said MOS transistor and said spiral inductor to each other, and a second portion electrically connecting said spiral inductor and said pad to each other.

10. The semiconductor integrated circuit according to claim 9, wherein said interconnection and the drain of said protective NMOS transistor are connected to each other upon formation of said interconnection by plasma etching, at the first portion.

* * * * *